(12) United States Patent
Bennatan et al.

(10) Patent No.: US 10,735,141 B2
(45) Date of Patent: Aug. 4, 2020

(54) SYSTEM AND A METHOD FOR ERROR CORRECTION CODING USING A DEEP NEURAL NETWORK

(71) Applicant: Huawei Technologies Co., Ltd., Shenzhen (CN)

(72) Inventors: Amir Bennatan, Hod Hasharon (IL); Yoni Choukroun, Hod Hasharon (IL); Pavel Kisilev, Hod Hasharon (IL); Junqiang Shen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 31 days.

(21) Appl. No.: 16/229,820

(22) Filed: Dec. 21, 2018

(65) Prior Publication Data
US 2020/0204299 A1    Jun. 25, 2020

(51) Int. Cl.
| | |
|---|---|
| *H03M 13/00* | (2006.01) |
| *H04L 1/00* | (2006.01) |
| *H03M 13/11* | (2006.01) |
| *G06N 3/08* | (2006.01) |
| *G06N 3/04* | (2006.01) |

(52) U.S. Cl.
CPC ......... *H04L 1/0063* (2013.01); *G06N 3/0445* (2013.01); *G06N 3/0481* (2013.01); *G06N 3/084* (2013.01); *H03M 13/1177* (2013.01)

(58) Field of Classification Search
None
See application file for complete search history.

(56) References Cited

U.S. PATENT DOCUMENTS

| | | | | |
|---|---|---|---|---|
| 5,594,597 | A * | 1/1997 | Padden | G06N 3/063 706/20 |
| 7,684,982 | B2 * | 3/2010 | Taneda | G10L 15/25 379/392.01 |
| 2004/0045030 | A1 * | 3/2004 | Reynolds | H04L 29/06 725/110 |
| 2010/0231796 | A1 * | 9/2010 | Mandelli | H04N 5/357 348/607 |

(Continued)

OTHER PUBLICATIONS

Bennatan et al., "Deep Learning for Decoding of Linear Codes—A Syndrome-Based Approach," arXiv:1802.04741v1 [cs.IT] (Feb. 13, 2018).

(Continued)

*Primary Examiner* — Mujtaba M Chaudry
(74) *Attorney, Agent, or Firm* — Leydig, Voit & Mayer, Ltd.

(57) ABSTRACT

A system for reducing analog noise in a noisy channel, comprising: an interface configured to receive analog channel output comprising a stream of noisy binary codewords of a linear code; and a computation component configured to perform the following: for each analog segment of the analog channel output of block length: calculating an absolute value representation and a sign representation of a respective analog segment, calculating a multiplication of a binary representation of the sign representation with a parity matrix of the linear code, inputting the absolute value representation and the outcome of the multiplication into a neural network for acquiring a neural network output, and estimating a binary codeword by component-wise multiplication of the neural network output and the sign representation.

17 Claims, 8 Drawing Sheets

(56) References Cited

U.S. PATENT DOCUMENTS

| | | | | |
|---|---|---|---|---|
| 2013/0225097 | A1* | 8/2013 | Hong | H04B 15/00 455/77 |
| 2015/0294667 | A1* | 10/2015 | Kim | G10L 21/034 704/233 |
| 2017/0041039 | A1* | 2/2017 | Hwang | H04B 1/48 |
| 2018/0204131 | A1* | 7/2018 | Najafi | G06N 7/005 |

OTHER PUBLICATIONS

Richardson et al., "Modern Coding Theory," Preliminary version, Cambridge University Press, pp. 1-590 (Oct. 18, 2007).

Fossorier et al., "Soft-Decision Decoding of Linear Block Codes Based on Ordered Statistics," IEEE Transactions on Information Theory, vol. 41, No. 5, pp. 1379-1396, Institute of Electrical and Electronics Engineers, New York, New York (Sep. 1995).

Fossorier et al., "Reliability-Based Syndrome Decoding of Linear Block Codes," IEEE Transactions on Information Theory, vol. 44, No. 1, pp. 388-398, Institute of Electrical and Electronics Engineers, New York, New York (Jan. 1998).

Gruber et al., "On Deep Learning-Based Channel Decoding," arXiv:1701.07738v1 [cs.IT], pp. 1-6 (Jan. 26, 2017).

O'Shea et al., "An Introduction to Deep Learning for the Physical Layer," arXiv:1702.00832v2 [cs.IT], pp. 1-13 (Jul. 11, 2017).

Nachmani et al., "Deep Learning Methods for Improved Decoding of Linear Codes," arXiv:1706.07043v2 [cs.IT], IEEE Journal of Selected Topics in Signal Processing, pp. 1-13, Institute of Electrical and Electronics Engineers, New York, New York (Jan. 1, 2018).

Nachmani et al., "Near Maximum Likelihood Decoding with Deep Learning," arXiv:1801.02726v1 [cs.IT], pp. 1-5 (Jan. 8, 2018).

Shirvanimoghaddam et al., "Short Block-length Codes for Ultra-Reliable Low Latency Communications," arXiv:1802.09166v4 [cs.IT], pp. 1-8 (Sep. 5, 2018).

Dimnik et al., "Improved Random Redundant Iterative HDPC Decoding," IEEE Transactions on Communications, vol. 57, No. 7, pp. 1-4, Institute of Electrical and Electronics Engineers, New York, New York (Jul. 2009).

Cho et al., "Learning Phrase Representations using RNN Encoder—Decoder for Statistical Machine Translation," arXiv:1406.1078v3 [cs.CL], pp. 1-15 (Sep. 3, 2014).

Hochreiter et al., "Long Short-Term Memory," Neural Computation 9(8):1735-1780, pp. 1-32 (1997).

Fougstedt et al., "Low-Power Low-Latency BCH Decoders for Energy-Efficient Optical Interconnects," Journal of Lightwave Technology, vol. 35, No. 23, pp. 5201-5207 (Dec. 1, 2017).

Forney et al., "Modulation and Coding for Linear Gaussian Channels," IEEE Transactions on Information Theory, vol. 44, No. 6, pp. 2384-2415, Institute of Electrical and Electronics Engineers, New York, New York (Oct. 1998).

Graves et al., "Speech Recognition With Deep Recurrent Neural Networks," arXiv:1303.5778v1 [cs.NE], pp. 1-5 (Mar. 22, 2013).

Yoon et al., "Virtualized and Flexible ECC for Main Memory," ASPLOS'10, Pittsburgh, Pennsylvania, USA., pp. 397-408 (Mar. 13-17, 2010).

* cited by examiner

SYSTEM AND A METHOD FOR ERROR CORRECTION CODING USING A DEEP NEURAL NETWORK

BACKGROUND

Forward error correction (FEC) systems are components in communication systems whose purpose is to overcome noise resulting from channel fluctuations. FEC systems include an encoder and a decoder, where the encoder receives strings of binary bits known as messages, to which it may add parity bits that are computed from each message. The resulting string is known as a codeword. Codewords are input into a communication channel that may corrupt codewords by noise. A decoder obtains noisy channel outputs and attempts to reproduce an exact replica of message bits by using corresponding parity bits. The encoder and decoder agree on a code, which is a protocol describing how parity bits are computed, and often includes a parity matrix. Relevant noisy communication channels include wireless communications, flash memory voltage fluctuations, optical distortions in fiber-optic communications, and many more. The objective of FEC system design is to reduce bit error rate (BER) at the decoder output. BER is a function of several parameters including codeword length (known as block length), level of channel noise, and code rate which measures the ratio between message length and block length.

SUMMARY

It is an object of the present disclosure to provide a system and a method for error correction coding using deep neural networks.

The foregoing and other objects are achieved by the features of the independent claims. Further implementation forms are apparent from the dependent claims, the description and the figures.

According to a first aspect of the disclosure, a system for reducing analog noise in a noisy channel comprises processing circuitry configured to receive analog channel output comprising a stream of noisy binary codewords of a linear code; and for each analog segment of the analog channel output of block length: calculate an absolute value representation and a sign representation of a respective analog segment, calculate a multiplication of a binary representation of the sign representation with a parity matrix of the linear code, input the absolute value representation and the outcome of the multiplication into a neural network for acquiring a neural network output, and estimate a binary codeword by component-wise multiplication of the neural network output and the sign representation.

According to a second aspect of the disclosure, a method for reducing analog noise in a binary channel comprises: receiving analog channel output comprising a stream of binary codewords of a linear code; for each analog segment of the analog channel output of block length: calculating an absolute value representation and a sign representation of a respective analog segment, calculating a multiplication of a binary representation of the sign representation with a parity matrix of the linear code, inputting the absolute value representation and the outcome of the multiplication into a neural network for acquiring an output, and estimating a binary codeword by component wise multiplication of the output and the sign representation.

With reference to the first and second aspects, optionally, the neural network is or has been trained by sequentially employing a plurality of random words having the block length.

With reference to the first and second aspects the system or the method may comprise: pre-processing each respective analog segment to create a permuted segment by applying a permutation selected from an automorphism group of the linear code, such that a reliability operator between the permuted segment and a respective codeword is maximized on predefined coordinates matching coordinates of a respective pre coded word of the codeword; applying an inverse of the permutation on each binary codeword estimated by the neural network.

With reference to the first and second aspects, optionally, the reliability operator is the mutual information.

With reference to the first and second aspects, optionally the system or the method may comprise for each analog segment: selecting a permutation to create from the analog segment a permuted segment such that a reliability operator between the permuted segment and a respective codeword is maximized on predefined coordinates matching: a) coordinates of a respective pre coded word of the codeword, and b) components of the permuted segment which are linear independent over a binary field; inputting the respective analog segment into the neural network; applying the permutation to the neural network output; creating a shortened output of the permuted output by discarding components of the permuted neural network output with coordinates which are not matching coordinates of a respective pre coded word of the codeword; calculating a respective value for each of the discarded components; adding the respective values to the shortened output at respective coordinates matching the discarded components, and estimating a codeword by applying an inverse of the permutation applied to the neural network output.

With reference to the first and second aspects, the neural network optionally comprises a plurality of fully connected layers whereas a plurality of neurons in each layer receive as inputs both inputs to the neural network and outputs of a preceding layer.

With reference to the first and second aspects, optionally, each neuron of the neural network is activated by a rectified linear unit non linear activation function.

With reference to the first and second aspects, optionally each inner layer of the neural network comprises an amount of neurons from an amount of the plurality of neurons which is a multiple of block length.

With reference to the first and second aspects, optionally, an output layer of the neural network comprises an amount of neurons from an amount of the plurality of neurons which is block length.

With reference to the first and second aspects, in an ninth possible implementation of the first and second aspects of the present disclosure, optionally, the neural network output is produced by employing a hyperbolic tangent function.

With reference to the first and second aspects, optionally, the neural network is a recurrent neural network (RNN) comprised of a plurality of layers each comprised of a plurality of neurons such that:

neurons in each layer are connected to each other in a linear order, and in each layer except for an output layer, each neuron is connected to a respective neuron in a following layer.

With reference to the first and second aspects, optionally, each neuron of the RNN is a gated recurrent unit (GRU) activated by using a hyperbolic tangent nonlinear activation function.

With reference to the first and second aspects, optionally, each layer of the RNN comprises an amount of neurons from an amount of the plurality of neurons which is a multiple of block length.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

Unless otherwise defined, all technical and/or scientific terms used herein have the same meaning as commonly understood by one of ordinary skill in the art to which the disclosure pertains. Although methods and materials similar or equivalent to those described herein can be used in the practice or testing of embodiments of the disclosure, example methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the disclosure are herein described, by way of example only, with reference to the accompanying drawings. With specific reference now to the drawings in detail, it is stressed that the particulars shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
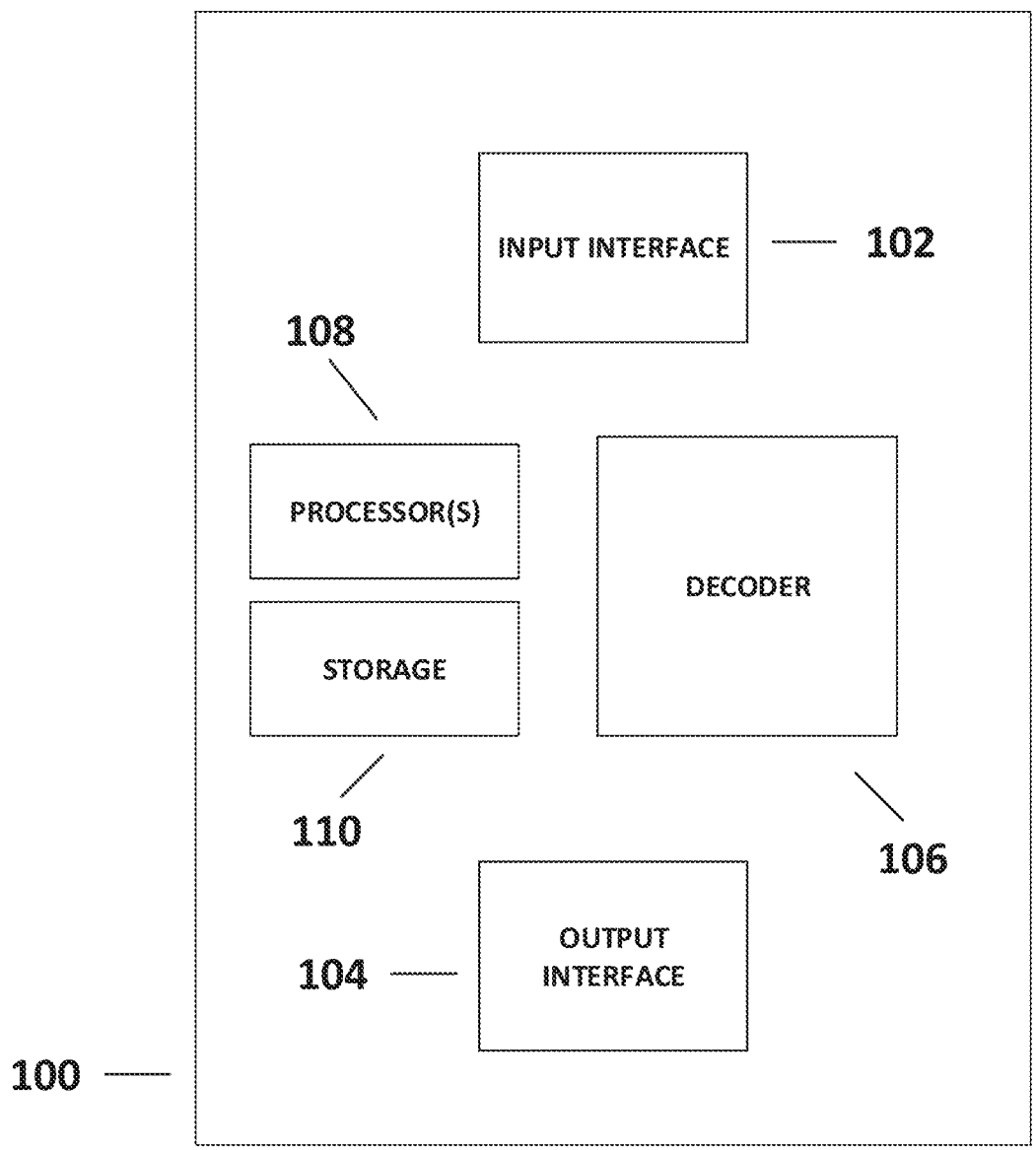
FIG. 1 is an example layout of typical components of a decoder system.

The present disclosure, in some embodiments thereof, relates to error correction coding and, more specifically, but not exclusively, to error correction coding using deep neural networks. It is desired that a code achieve low BER at high rates with low complexity and short block lengths. These characteristics may enable bandwidth efficiency, low cost, low power consumption, and low pipeline latency.

According to some embodiments of the present disclosure there are provided communication systems in which systems and methods attempt to overcome noise resulting from communication channel fluctuations. According to some embodiments of the present disclosure, there is provided a system that applies to FEC systems and includes a description of a decoder, together with several extensions, which may be employed by an FEC system over a noisy analog channel.

In some embodiments, an FEC system receives binary messages that are input into an encoder. The encoder encodes binary messages by employing a mapping of strings of message bits to strings of coded bits (the codewords). Optionally, the mapping relies on a known result stating that for linear codes, for each codeword there exists an equivalent representation in which a respective codeword is assembled by appending parity bits to message bits. It is assumed equivalent representations of codewords are used hereof.

Codewords are then input into a communication channel. Channel outputs are then input into a decoder, which may employ a parity matrix in order to produce an exact replica of each message. A block length of a code is hereby defined as a length of each codeword. Soft decoders are defined as decoders which do not require binary inputs.

A decoder that may be applied to soft decoding is described, where in some embodiments of the present disclosure, the decoder is comprised of a preprocessing component that produces a pair of vectors, a neural network (NN) that receives as input the result of the preprocessing, and a post processing component that estimates a codeword based on the NN output.

In some embodiments of the present disclosure, the NN may be pre-trained by using random noise, which may be distributed in accordance with specific channel characteristics. For example, for an additive Gaussian white noise (AWGN) channel, the NN may be trained by adding noise vectors where each is distributed as a zero mean random variable with independent components.

In some embodiments of the present disclosure, the pair of NN input vectors chosen exhibit certain mathematical properties in relation to any noise disruption in a wide class of channels known as binary input symmetric output (BISO) channels, such that estimating codewords involves no penalty in performance in terms of channel metrics and is resilient to overfitting. BISO channels include channels such as binary-input AWGN channels, binary symmetric channels (BSCs) and many others.

The decoder described may have several additional advantages:
1. The decoder may be applied to any block length.
2. The decoder allows unconstrained NN design, which allows for flexible design of FEC decoders.
3. The decoder exhibits low decoding latency, due to the fact that NNs are highly parallelizable.
4. Standardization, since the decoder may be applied to any code, as opposed to many alternative low complexity decoding algorithms tailored to specific codes such as Bose Chaudhuri Hocquenghem (BCH) codes, Low Density Parity Check (LDPC) codes, and Polar codes.

There exist prior art soft decoders. Common among these are ordered statistics decoders (OSDs) and belief propagation (BP) decoders. Drawbacks of OSDs include high time complexity and latency, as OSDs are not parallelizable and incorporate several time consuming procedures. BP decoders are commonly used to decode LDPC codes with long block lengths. Major drawbacks of BP decoders include requiring block lengths of thousands of bits long in order to achieve low BER rates, a condition unfeasible for many applications, and having an Application Specific Integrated Circuit (ASIC) implementation, which is large ($mm^2$), implying large production costs and power consumption.

In comparison to some embodiments of the present disclosure, alternative conventional approaches in applying NNs to decoding exhibit several drawbacks. For example, some conventional approaches employ a NN directly inputted by a channel output in order to estimate a codeword. As opposed to some embodiments of the present disclosure, the method of directly inputting an NN (as in the prior art) is vulnerable to overfitting, since the space of valid message is exponential in the message length, and therefore it is unfeasible to account for even a small fraction of valid messages other than in a space consisting of very short block lengths during training.

Still other conventional approaches provide a decoder based on the BP decoder, which uses a NN whose structure mimics that of a BP graph used in BP algorithms in order to generate neuron weights which are in turn applied to the BP graph. A major drawback of this method in comparison to some embodiments of the present disclosure is that the NN is restricted in structure to resemble that of the BP graph, which does not enable application of potentially useful NN architectures of recent years.

Accordingly, some embodiments of the disclosure overcome the drawback of the conventional approaches discussed above.

In some embodiments of the present disclosure, denote hereby X to be a codeword channel input of length N corresponding to a message of length K (i.e., so there are N−K parity bits), and Y to be a noisy channel output corresponding to X. Some embodiments of the present disclosure include one or two independent extensions. Both extensions may improve NN processing by increasing reliabilities of message bits in each noisy codeword by employing a reliability operator. In some embodiments of the present disclosure, this may be implemented by setting the reliability operator to be a mutual information operator, denoted as I(X; Y), in order to statistically relate X and Y. Some embodiments denote by H(Z) the entropy of a random variable Z, then I(X; Y) is defined as:

$$I(X;Y)=H(X)-H(X|Y)=H(Y)-H(Y|X)$$

The operator I(X; Y) measures the predictability of X for a given Y. It is assumed that the first K components of a channel input X are message bits. Denote by y any component of Y. Define the adjusted reliability of y, hereby known as the "reliability" of y, to be R(y)=I(X; Y||Y|=|y|). Reliability measures the predictability of the channel input based on a single component of the channel output.

Some embodiments of the present disclosure may include an extension, hereby known as a "permutation based extension," comprised of preprocessing and post processing procedures that may improve the performance of the decoder by preprocessing each channel output by applying a permutation selected by the preprocessing procedure which guarantees that a permuted channel output is a valid channel output of a codeword. Optionally, the permutation selected is chosen to maximize reliabilities of the first K components of the permuted channel output and, in doing so, may aid learning for the NN, as the message bits may be counted on by the NN to have a higher reliability. The post processing step consists of estimating a codeword by applying the inverse permutation previously applied to the channel output.

Some embodiments of the present disclosure may include an extension, hereby referred to as a "hybrid OSD decoder," which may enable improved performance in terms of a frame error rate (FER) metric that measures the amount of codewords that are wrongly decoded, rather than measurement in bit wise metrics such as BER or mean square error (MSE). The hybrid OSD method of decoding comprises of the method of the described decoder with an added preprocessing and post processing procedure, which may avoid the complexity issues of OSDs. The preprocessing step selects a permutation with the same criteria as the OSD permutation selection. The permutation selected is applied to the decoder output, and next the hybrid OSD decoder discards the N−K least reliable components and create new components to replace them by using the K most reliable components of Y. The step of creating new components for Y may avoid complexity issues encountered in OSD's and may be justified by the manner in which the permutation is selected, which guarantees that the last N−K components of Y may be deterministically completed from the first K components of Y. Finally, an inverse permutation may be applied in order to estimate a valid codeword.

Some embodiments of the present disclosure may include one of two NN architectures designed to enhance performance of the decoder. One NN architecture, hereby referred to as a "vanilla architecture," may be comprised of a multi-layered fully connected NN, in which all neurons receive the NN inputs. In some embodiments of the present disclosure, layers may consist of the same number of neurons, a number which may be a multiple of block length, and each layer may be fully connected to the layer preceding it; whereas, the final layer may optionally have N neurons and produce the NN output.

A second NN architecture is a recurrent NN (RNN), which may be multi-layered and is optionally comprised of gated recurrent units (GRUs) that may be stacked as equally sized layers. Optionally, in each layer the GRUs are linearly ordered in terms of inputting each other, and in each layer each GRU may input exactly one corresponding GRU in a following layer. This type of architecture may generate hidden memory states within a RNN which may improve RNN predictive accuracy.

Before explaining at least one embodiment of the disclosure in detail, it is to be understood that the disclosure is not necessarily limited in its application to the details of construction and the arrangement of the components and/or methods set forth in the following description and/or illustrated in the drawings and/or the Examples. The disclosure is capable of other embodiments or of being practiced or carried out in various ways.

The present disclosure may be a system, a method, and/or a computer program product. The computer program product may include a computer readable storage medium (or media) having computer readable program instructions thereon for causing a processor, in response to executing the instructions, to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Computer readable program instructions described herein can be downloaded to respective computing/processing devices from a computer readable storage medium or to an external computer or external storage device via a network, for example, the Internet, a local area network, a wide area network and/or a wireless network.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatuses, systems, and computer program products according to embodiments of the disclosure. Each block of the flowchart illustrations and/or block diagrams, and combinations of blocks in the flowchart illustrations and/or block diagrams, can be implemented by computer readable program instructions.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference is now made to FIG. 1, which schematically depicts an example of a decoder system 100. The decoder system 100 comprises processing circuitry, which may include hardware, firmware, and software. In the shown example, the processing circuitry comprises computation components 102, 104, 106, 108, 110, e.g., an input interface 102 and an output interface 104, a decoder 106, a processor 108, and a storage 110. For example, the input and output interfaces 102, 104 may be implemented in software or firmware (such as in ASIC or FPGA). The decoder 106 may serve for decoding binary and/or analog segments of pre-defined lengths, and may use at least one external processor, as depicted in 108, and/or external storage, as depicted in 110.

Figure 2:
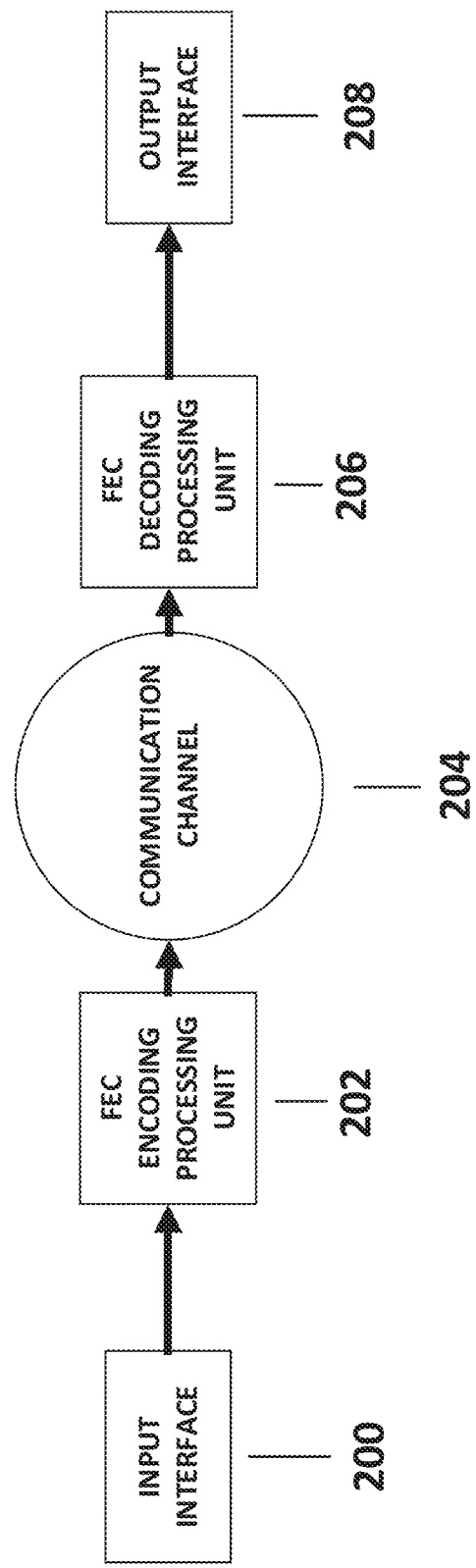
FIG. 2 is an example layout of a typical FEC system and its operation across a noisy communication channel.

Reference is now made to FIG. 2, which illustrates main components of a typical FEC system and its operation across a noisy communication channel. As shown in 200, an input interface that receives messages, for example originated from a computer system, communicates with an FEC encoding processing unit, hereby known as an "encoder," as shown in 202. Optionally, messages may be encoded by the encoder by adding parity bits to the message. As shown in 204, the encoder inputs a coded message through a communication channel, which as shown in 206, is received by an FEC decoding processing unit, hereby known as a "decoder." The coded message outputted by the communication channel may be noisy, meaning the coded message may be disrupted, for example a coded message equal to (1, −1, 11) may be outputted by the communication channel as (5, −2, −6, 8). The decoder decodes a noisy message in order to retrieve a decoded message without noise, which is then outputted to an output interface, as shown in 208, which then may, for example, communicate an output to a computer system.

In this description, it is assumed that a decoding process executed by a decoder involves a parity matrix agreed upon with an encoder, that messages received by an encoder are binary, and that codewords transmitted by an encoder over a communication channel are in a bipolar form. This may be implemented, for example, by mapping 0 valued bits to −1 and 1 valued bits to 1. It is further assumed that communication channel outputs, as mentioned herein, are of block length.

Figure 3:
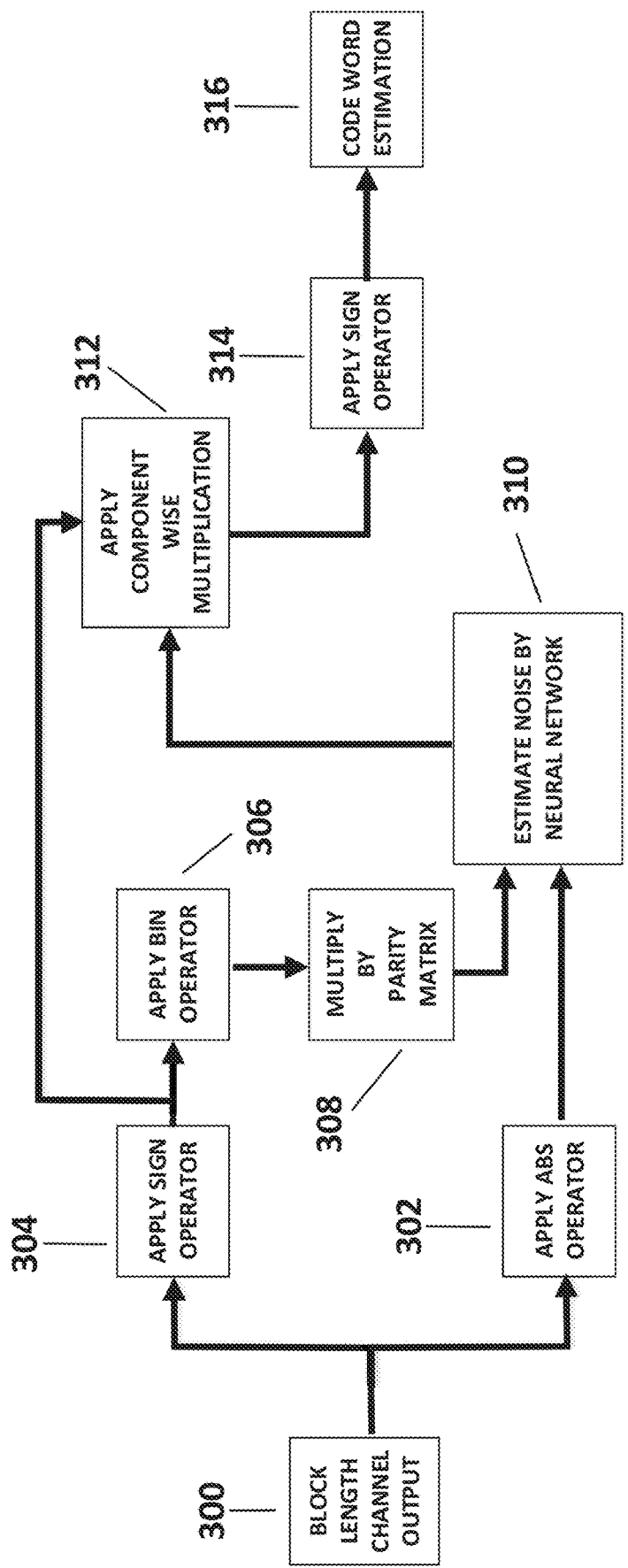
FIG. 3 is an example depiction of a data flow of a method optionally employed by a decoder, according to some embodiments of the present disclosure.

Reference is also now made to FIG. 3, which depicts a data flow of a method optionally employed by a decoder. The method comprises of applying a NN to noisy channel output of block length in order to estimate noise, and then use the noise estimation to produce a codeword estimation as output. As shown in 300, the decoder receives noisy channel outputs, and as depicted in 302 and 304, the decoder transforms a given noisy channel output, denoted hereby as Y, into a pair of vectors of block length. One vector, as shown in 302, is produced by applying an operator, hereby denoted by abs, to produce an absolute value representation of channel output. For example, if Y=(2, −3, 5, −8) then abs(Y)=(2, 3, 5, 8). The second vector, hereby known as a "syndrome" of Y, is the result of a multiplication of a binary representation of a sign representation of Y with a code parity matrix, hereby denoted as H. As shown in 304, an operation which outputs component signs, denoted as sign, is applied to Y. For example, according to some embodiments of the present disclosure, if Y=(2, −3, 5, −8) then sign(Y)=(1, −1, 1, −1). As shown in 306, an operator that outputs binary components, denoted as bin is next applied, for example, according to some embodiments of the present disclosure, bin(1, −1, 1, −1)=(1, 0, 1, 0). Multiplication of the bin operation output by the parity matrix, as shown in 308, produces the syndrome of Y. Denote by Z the noise associated with a codeword X resulting in channel output Y. Since X is a valid codeword, X is within ker(H), and so multiplying the parity matrix H by the syndrome of Y results in: H*(X+bin(sign(Z)))=H*0+H*bin(sign(Z))=H*bin(sign(Z)). Since it is also true that abs(Y)=abs(Z), the NN inputs are dependent only on channel noise Z. Next, as shown in 310, the computed syndrome and absolute value representation, which are both dependent only on channel noise, are inputted into a NN which produces a noise estimation output. As shown in 312, the NN output vector is then post processed by component wise multiplication of the output vector with the sign representation of the channel output, for example component wise multiplication of (2, 5, −3) and (2, −1, 4) results in (4, −5, −12). As shown in 314, a sign representation of the component wise multiplication is produced in order to output an estimated codeword, as shown in 316.

In BISO channels it is the case that channel output may be modelled as Y=X*Z, where channel noise Z is independent of a codeword X, where multiplication is component-wise. Therefore, an estimation of the channel noise paired with Y may be sufficient to produce an estimation of X.

Reference is now made to "Deep Learning for Decoding of Linear Codes-A Syndrome-Based Approach" by A. Bennatan, Y. Choukroun and P. Kisilev, published at arXiv: 1802.04741 on Feb. 13, 2018. In this publication (the content of which is incorporated herein by reference) it is proven that over binary input symmetric output (BISO) channels the described decoder framework involves no penalty in performance in terms of mean squared error (MSE) or bit error rate (BER) metrics, in the sense that with an appropriately designed NN the decoder can achieve maximum a-posteriori (MAP) or minimum MSE (MMSE) decoding. Furthermore, it is proven in "Deep Learning for Decoding of Linear Codes-A Syndrome-Based Approach" by A. Bennatan, Y. Choukroun and P. Kisilev that within BISO channel settings the decoder's BER and MSE metrics are both invariant to any transmitted codeword, an invariance that implies resilience of the decoder to overfitting for any block length.

Figure 4:
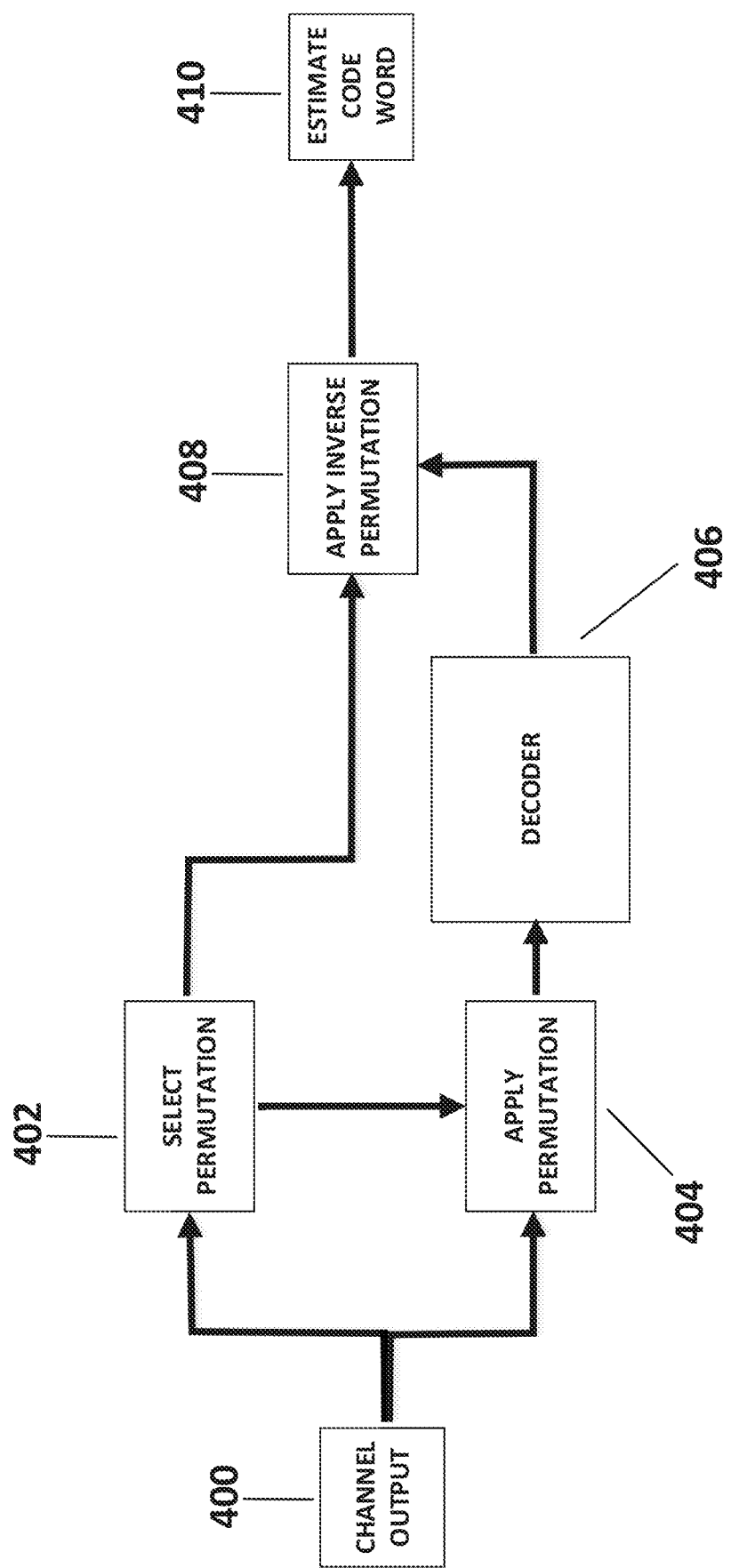
FIG. 4 is an example depiction of the method of a permutation based extension of the decoder by applying, according to some embodiments of the present disclosure.

Reference is also now made to FIG. 4, which, according to some embodiments of the present disclosure, depicts the permutation based extension to the method of codeword estimation by the decoder. The permutation based extension employs permutations which are applied to noisy channel output segments of block length in order to facilitate NN computations. As shown in 400, the permutation based extension receives noisy channel outputs, which are then employed, as shown in 402, in order to select a permutation. Optionally, the permutation is selected from the linear code automorphism group, a selection which guarantees that a permuted codeword is also a codeword. Optionally, the permutation is selected from the automorphism group such that adjusted reliabilities are maximized on the components of channel output Y which correspond to bits of a pre coded message of size K. The permutation selected is then applied to the channel output as shown in 404, and permuted channel output is then inputted into the decoder, as shown in 406. By increasing reliability of the first K bits of each permuted noisy codeword the described decoder may improve its accuracy in estimating a codeword. An inverse permutation to the one previously applied is applied to the decoder output as shown in 408, which is then outputted as an estimated codeword as shown in 410.

Figure 5:
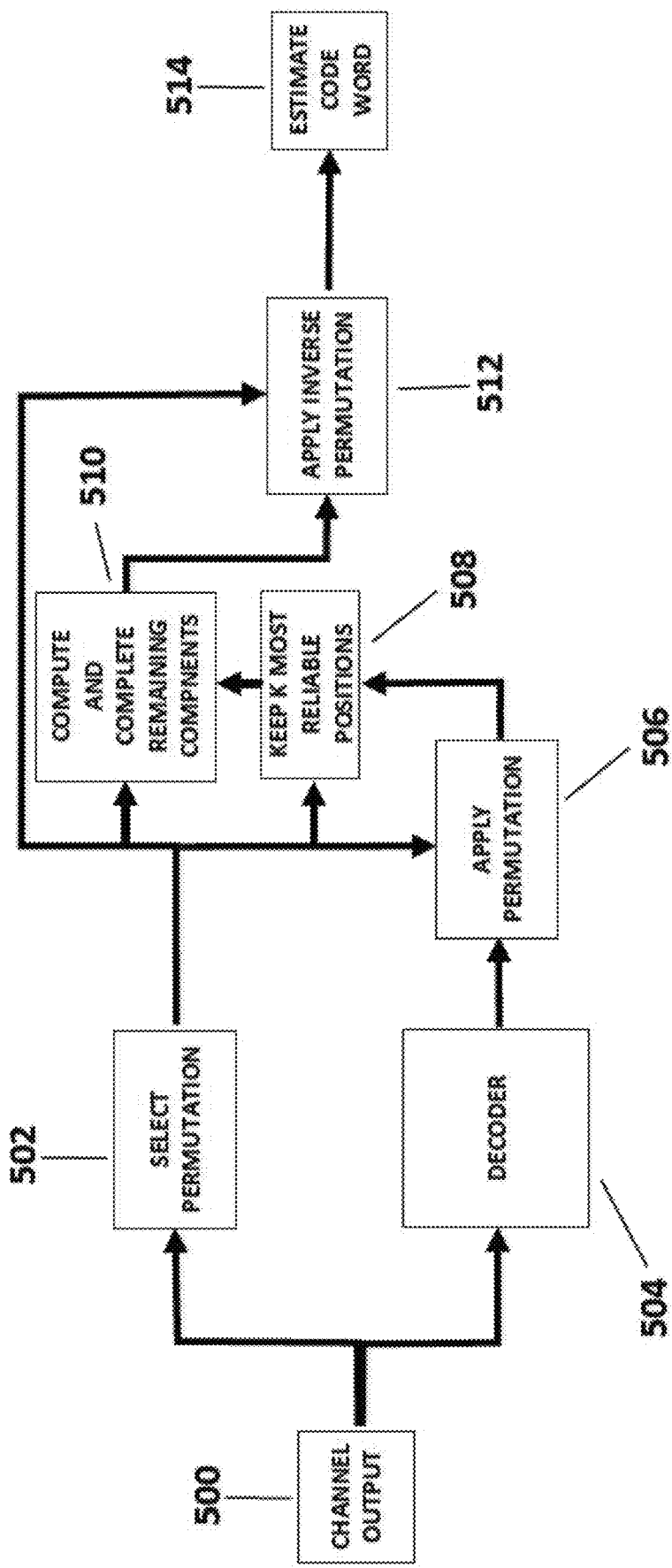
FIG. 5 is an example depiction of the method of the OSD hybrid decoder extension of the decoder, according to some embodiments of the present disclosure.

Reference is also now made to FIG. 5, which depicts a data flow in the above referred to hybrid OSD decoder, according to some embodiments of the present disclosure. The flow is part of a method of estimating codewords based on noisy channel outputs. As shown in 500, the hybrid OSD decoder receives noisy channel outputs. As shown in 502, a permutation is selected based on a channel output. Optionally, a selection process of the permutation may be performed to maximize reliabilities of the first K components of a noisy codeword while maintaining the first K components to be linearly independent over a binary field. As shown in 504, the channel output is inputted into the decoder, whose output is then processed in 506 by applying to it the permutation selected. Optionally, the hybrid OSD decoder determines N−K permuted decoder output components by a computation based on the first K most reliable components. This computation differs from known OSD algorithms, which employ a time consuming candidate selection process. Optionally, the hybrid OSD decoder first keeps the K most reliable components and discards the rest, as shown in 508. Optionally, as shown in 510, the remaining N−K components are completed from the first K components. The completion may be achieved by using a matrix resulting from the OSD permutation selection process. The parity matrix H satisfies*x=0, wherein x is any valid codeword. The OSD permutation selection process modifies H by rearranging its columns and performing row operations so that the last N−K columns are diagonal. Rearranging columns is the same as applying a permutation. Denote by $\pi$ a permutation corresponding to the column rearrangement of H, denote by $\pi(x)$ the application of $\pi$ to the components of x, and denote by H' the matrix resulting from applying the rearrangement of the columns of H.

By linear algebraic arguments, it is derived that H' *$\pi(x)$= 0, and according to matrix diagonalization performed within the OSD permutation selection process:

$$H' * \pi(x) = \begin{bmatrix} P & 0 \\ 0 & I \end{bmatrix} * \pi(x),$$

whereas P denotes a binary matrix and 1 denotes a N−K identity matrix. Therefore:

$$0 = H'^{*}\pi(x) = P^{*}(\pi(x)_1, \ldots, \pi(x)_K, 0, \ldots, 0)^t + (0, \ldots, 0, \pi(x)_{K+1}, \ldots, \pi(x)_N)^t.$$

Thus, given the first K components of $\pi(x)$ it is possible to deterministically compute the remaining N−K components. Optionally, as shown in 510, N−K components are computed accordingly and are placed at respective coordinates in relation to the K first most reliable components of the permuted decoder output. Optionally, as shown in 512, an inverse permutation of the previously applied permutation is then applied to the completed word, and outputted from the OSD hybrid decoder as an estimated codeword, as shown in 514.

Figure 6:
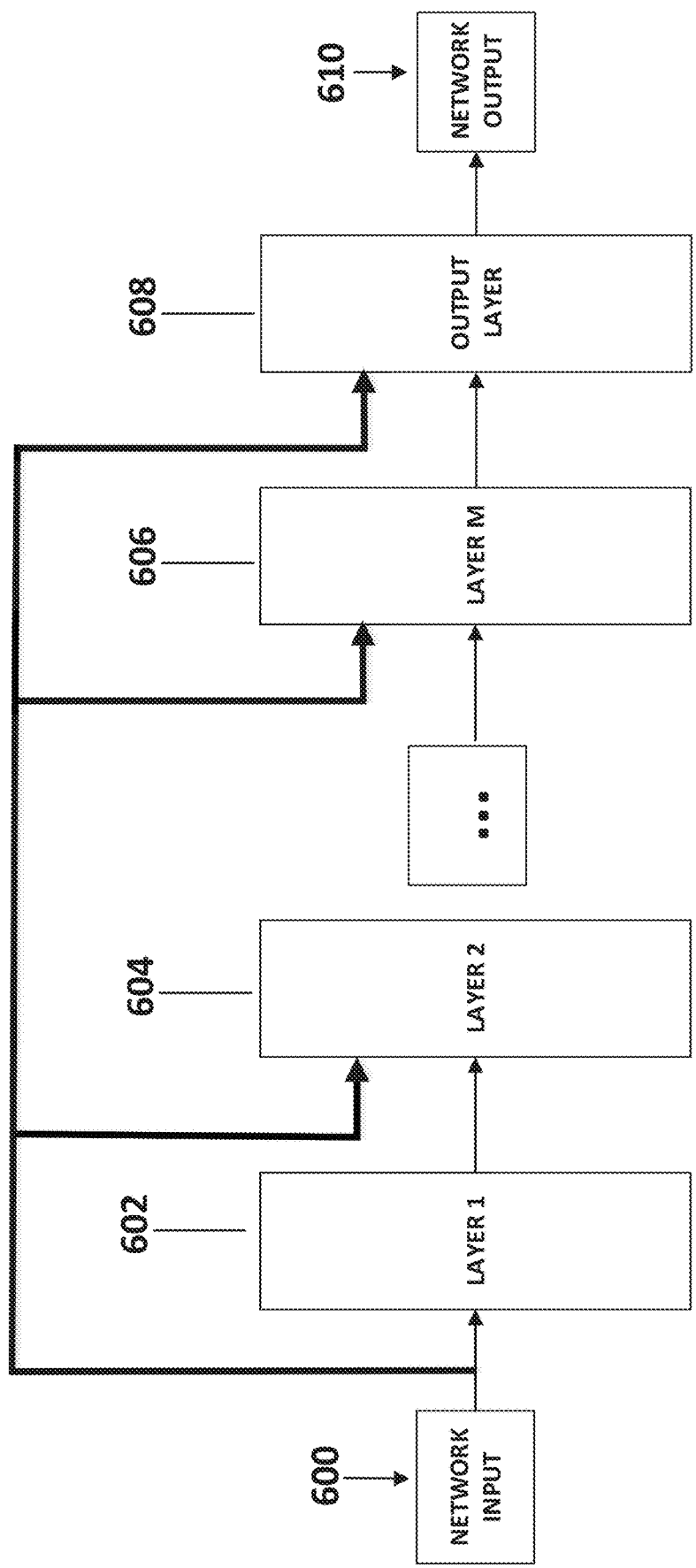
FIG. 6 is an example depiction of the vanilla neural network architecture, according to some embodiments of the present disclosure.

Reference is also now made to FIG. 6, which depicts the vanilla neural network (NN) architecture, according to some embodiments of the present disclosure. Optionally, as shown in 600, the vanilla NN receives input into a first layer, in which all neurons contained within each may receive the input. Optionally, as further shown in 602, 604, and 606, each layer may input a following layer whereas all neurons in each layer may be connected to all neurons in a following layer, and in addition the NN input may also be inputted into each neuron in each layer. Optionally, the neurons in each layer may be activated using a rectified linear unit (ReLU) non-linear activation function, and/or each layer may be comprised of an equal number of neurons, which may be equal to a multiple of block length. Optionally, as depicted in 608, an output layer may be comprised of a number of neurons equal to block length, and/or the output layer may produce the network output, as shown in 610, by using a hyperbolic tangent activation function.

Figure 7:
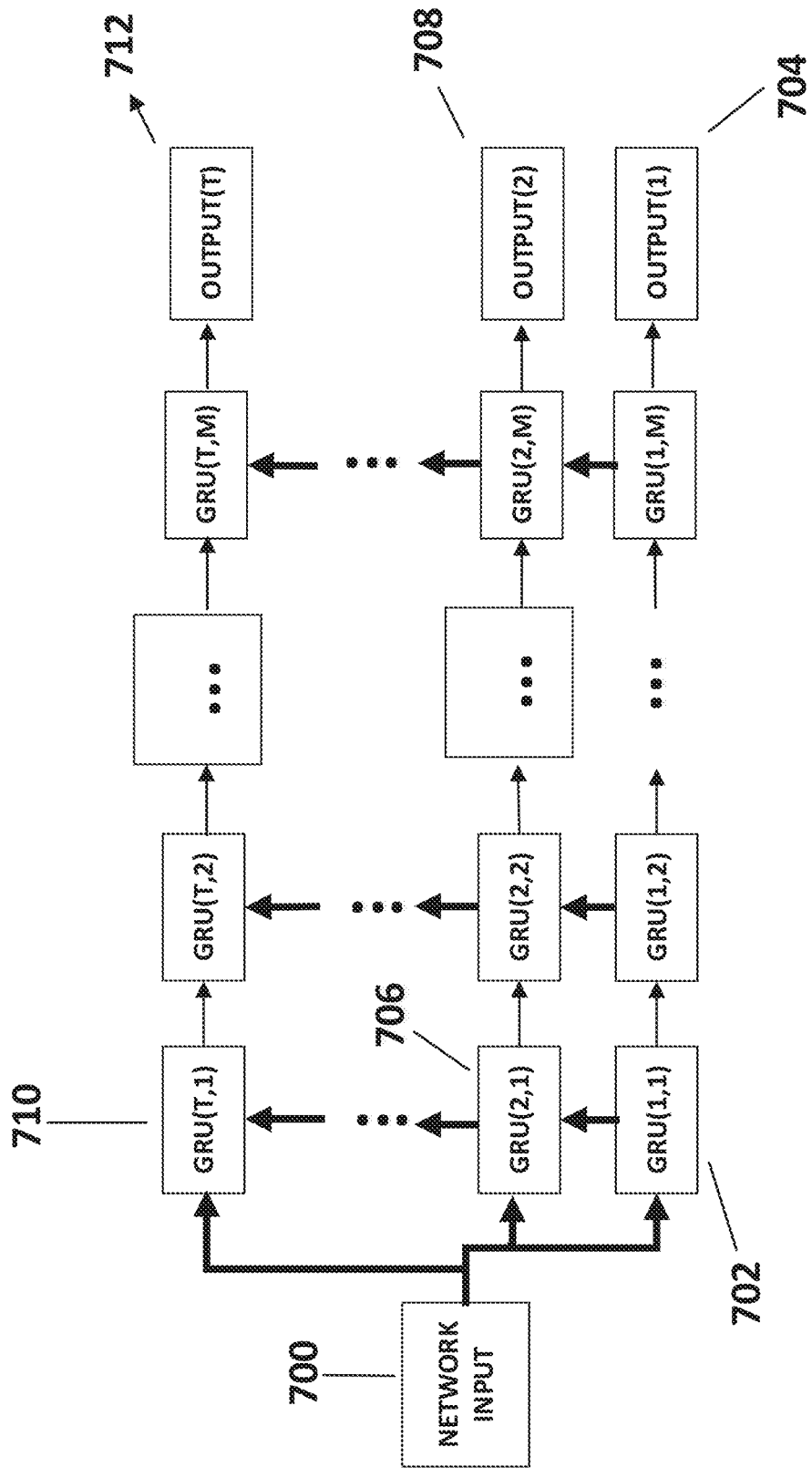
FIG. 7 is an example depiction of the RNN architecture, according to some embodiments of the present disclosure.

Reference is also now made to FIG. 7, which depicts the RNN architecture, according to some embodiments of the present disclosure. Optionally, each neuron in the RNN is implemented as a GRU, which are known to perform as well as long short term memory (LSTM) cells, but provide a faster alternative due to fewer parameters. Optionally, hyperbolic tangent nonlinear activation functions are used. Optionally, as seen in FIG. 7, the RNN architecture may consist of a grid like structure, of size T*M, whereas T denotes the number of layers in the RNN, and M denotes the number of neurons in each layer, which may be identical for all layers. As shown in FIG. 7, each layer may be linearly ordered such that for 1<i≤T, 1≤j≤M, wherein GRU (i,j) receives inputs from GRU (i−1, j) and from GRU(i, j−1), whereas for the cases j=1 and/or i=1 inputs may be as depicted in FIG. 7. Optionally, as shown in 700, the RNN input is distributed to each layer of the RNN. Optionally, as shown in 702, GRU(1,1) receives network input and in a linear manner each following GRU's in the first layer receive input and outputs to the next in line until, as shown in 704, OUTPUT(1) is produced. Optionally, the same process is repeated in 706 and 708 to produce OUTPUT(2), and so on, until finally in 710 and 712, OUTPUT(T) is produced. Each layer of the RNN may be thought of as a time step in which hidden memory states are activated. Optionally, OUTPUT(T) is used as the RNN output, wherein OUTPUT(i) for i=1 . . . T−1 may be employed during an RNN training stage. Optionally, according to some embodiments of the RNN, parameters M, T may be set to M=5*block length, and T=5.

Figure 8:
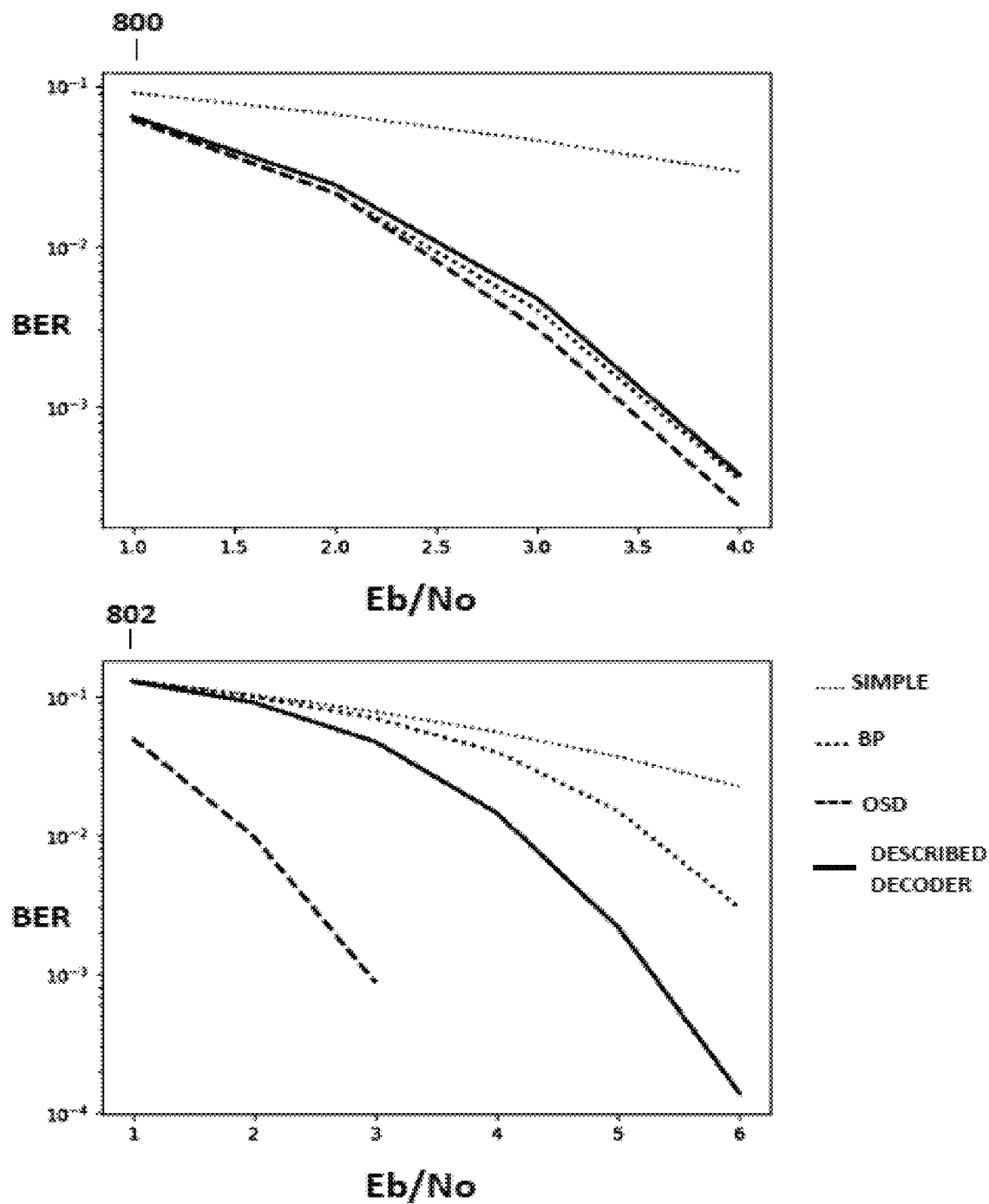
FIG. 8 depicts results of simulations using BCH(63,45) and BCH(127,64) codes of some embodiments of the present disclosure in comparison to prior art.

Reference is also now made to FIG. 8, which depicts results of simulations using BCH(63,45) and BCH(127,64) codes of some embodiments of the present disclosure in comparison to prior art. As shown in FIG. 8, a legend depicts four decoder implementations of which simulations are compared, 'simple' refers to simulations of an implementation of a NN directly inputted by a channel output in order to estimate a codeword, 'BP' refers to simulations of an implementation of a BP based NN decoder, 'OSD' refers to simulations of an implementation of an OSD, and 'DESCRIBED DECODER' refers to simulations of an embodiment of the present disclosure An embodiment of the present disclosure in the simulation results depicted in FIG. 8 was implemented in a basic form without any of the extensions described, and using an embodiment of the described RNN architecture. As shown in 800, a simulation using a BCH(63,45) code was performed using an encoder configured for 45 message bits and 18 parity bits, resulting in a block length of 63. Channel noise was modelled as AWGN, a typical scenario of wireless applications, for example. The parameter $E_b/N_0$ is a measure of noise relative to transmitted power, with low values of $E_b/N_0$ corresponding to high levels of noise. As shown in FIG. 8, it is seen that simulation results of an embodiment of the described decoder are similar in performance to prior arts performances depicted for the BCH(63,45) code, as shown in 800, whereas as seen in 802, the decoder described outperforms all depicted prior art excluding unfeasible OSD methods for the BCH(127,64) code.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant systems, methods and computer programs will be developed and the scope of the term neural network is intended to include all such new technologies a priori.

As used herein the term "about" refers to ±10%.

The terms "comprises", "comprising", "includes", "including", "having", and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an", and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" or "example" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

Throughout this application, various embodiments of this disclosure may be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable subcombination or as suitable in any other described embodiment of the disclosure. Certain features described in the context of various embodiments are not to be considered essential features of those embodiments, unless the embodiment is inoperative without those elements.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present disclosure. To the extent that section headings are used, they should not be construed as necessarily limiting.

What is claimed is:

1. A system for reducing analog noise in a noisy channel, the system comprising:
processing circuitry configured to:
receive analog channel output comprising a stream of noisy binary codewords of a linear code, wherein the analog channel output includes one or more analog segments; and
for each analog segment of the analog channel output that has a length equal to a block length:
calculate an absolute value representation and a sign representation of the analog segment,
calculate a multiplication of a binary representation of the sign representation with a parity matrix of the linear code,
input the absolute value representation and an outcome of the multiplication into a neural network, to acquire a neural network output, and
estimate a binary codeword by multiplying the neural network output and the sign representation.

2. The system of claim 1, wherein the neural network is trained by sequentially employing a plurality of random words having the block length.

3. The system of claim 1, wherein the processing circuitry is further configured to:
pre-process each analog segment that has a length equal to the block length to create a permuted segment by applying a permutation selected from an automorphism group of the linear code, such that a reliability operator between the permuted segment and a respective codeword is maximized on predefined coordinates matching coordinates of a respective pre-coded word of the codeword;
apply an inverse of the permutation on each binary codeword estimated by the neural network.

4. The system of claim 3, wherein the reliability operator is a mutual information operator.

5. The system of claim 1, wherein the processing circuitry is further configured to:
for each analog segment of the analog channel output that has a length equal to a block length:
select a permutation to create from the analog segment a permuted segment such that a reliability operator between the permuted segment and a respective codeword is maximized on predefined coordinates matching:
a) coordinates of a respective pre-coded word of the codeword; and
b) components of the permuted segment which are linear independent over a binary field;
input the analog segment into the neural network;
apply the permutation to the neural network output;
create a shortened output of the permuted output by discarding components of the permuted neural network output with coordinates that are not matching coordinates of a respective pre-coded word of the codeword;
calculate a respective value for each of the discarded components;
add the respective values to the shortened output at respective coordinates matching the discarded components, and
estimate a codeword by applying an inverse of the permutation applied to the neural network output.

6. The system of claim 1, wherein the neural network comprises a plurality of fully connected layers, wherein a plurality of neurons in each layer receive as inputs both inputs to the neural network and outputs of a preceding layer.

7. The system of claim 6, wherein each neuron of the neural network is activated by a rectified linear unit nonlinear activation function.

8. The system of claim 6, wherein each inner layer of the neural network comprises an amount of neurons from an amount of the plurality of neurons that is a multiple of the block length.

9. The system of claim 6, wherein an output layer of the neural network comprises an amount of neurons from an amount of the plurality of neurons which equals the block length.

10. The system of claim 6, wherein the neural network output is produced by employing a hyperbolic tangent function.

11. The system of claim 6, wherein the neural network is a recurrent neural network (RNN) comprising a plurality of layers, each layer comprising a plurality of neurons such that:
neurons in each layer are connected to each other in a linear order, and
in each layer except for an output layer, each neuron is connected to a respective neuron in a following layer.

12. The system of claim 6, wherein each neuron of the RNN is a gated recurrent unit (GRU) activated by using a hyperbolic tangent nonlinear activation function.

13. The system of claim 6, wherein each layer of the RNN comprises an amount of neurons from an amount of the plurality of neurons which is a multiple of block length.

14. A method for reducing analog noise in a binary channel, the method comprising:
receiving analog channel output comprising a stream of binary codewords of a linear code, wherein the analog channel output includes one or more analog segments;
for each analog segment of the analog channel output that has a length equal to a block length:
calculating an absolute value representation and a sign representation of the analog segment,
calculating a multiplication of a binary representation of the sign representation with a parity matrix of the linear code,
inputting the absolute value representation and an outcome of the multiplication into a neural network for acquiring an output, and
estimating a binary codeword by multiplying the output and the sign representation.

15. The method of claim 14, further comprising training the neural network by sequentially employing a plurality of random words having the block length.

16. The method of claim 14, further comprising:
pre-processing each analog segment that has a length equal to the block length to create a permuted segment by applying a permutation selected from an automorphism group of the linear code, such that a reliability operator between the permuted segment and a respective codeword is maximized on predefined coordinates matching coordinates of a respective pre-coded word of the codeword; and
applying an inverse of the permutation on each binary codeword estimated by the neural network.

17. A non-transitory computer-readable storage medium storing a program code that, when executed by a computer device, causes the computer device to perform the method of claim 14.

* * * * *